(12) United States Patent
Hsiao et al.

(10) Patent No.: US 12,232,309 B2
(45) Date of Patent: Feb. 18, 2025

(54) CAPACITOR AND METHOD FOR FORMING THE SAME

(71) Applicant: Winbond Electronics Corp., Taichung (TW)

(72) Inventors: Yu-Ping Hsiao, Taichung (TW); Cheol-Soo Park, Taichung (TW); Chun-Hung Cheng, Taichung (TW); Wei-Chieh Chuang, Taichung (TW); Wei-Chao Chou, Taichung (TW); Yen-Min Juan, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 426 days.

(21) Appl. No.: 17/592,751

(22) Filed: Feb. 4, 2022

(65) Prior Publication Data

US 2022/0415891 A1    Dec. 29, 2022

(30) Foreign Application Priority Data

Jun. 24, 2021   (TW) ................................ 110123116

(51) Int. Cl.
*H10B 12/00* (2023.01)
*H01G 4/008* (2006.01)
*H01G 4/01* (2006.01)

(52) U.S. Cl.
CPC ........... *H10B 12/00* (2023.02); *H01G 4/0085* (2013.01); *H01G 4/01* (2013.01)

(58) Field of Classification Search
CPC ......... H01L 28/40; H10L 28/90; H10B 12/00; H10B 12/02; H10B 12/0387; H10B 12/0383; H01G 4/0085; H10G 4/01
See application file for complete search history.

(56) References Cited

U.S. PATENT DOCUMENTS

| | | | |
|---|---|---|---|
| 8,058,678 B2 | 11/2011 | Kim et al. | |
| 9,018,733 B1* | 4/2015 | Lee ......................... | H01L 28/60 257/532 |
| 2012/0064690 A1 | 3/2012 | Hirota et al. | |
| 2012/0112317 A1 | 5/2012 | Kang et al. | |
| 2022/0231119 A1* | 7/2022 | Liu ........................ | H10B 12/31 |

FOREIGN PATENT DOCUMENTS

TW          201535681 A        9/2015

* cited by examiner

*Primary Examiner* — Latanya N Crawford Eason
(74) *Attorney, Agent, or Firm* — MUNCY, GEISSLER, OLDS & LOWE, P.C.

(57) ABSTRACT

A capacitor includes cup-shaped lower electrodes disposed on a substrate, a capacitor dielectric layer conformally covering inner surfaces and outer surfaces of the cup-shaped lower electrodes, and a support layer disposed between outer surfaces of the cup-shaped lower electrodes to connect the cup-shaped lower electrodes. The capacitor further includes an annealed oxide layer, which is interposed between the inner surfaces of the cup-shaped lower electrodes and the capacitor dielectric layer, and is also interposed between a portion of the outer surfaces of the cup-shaped lower electrodes and the capacitor dielectric layer. A method for forming the capacitor is also provided.

10 Claims, 11 Drawing Sheets

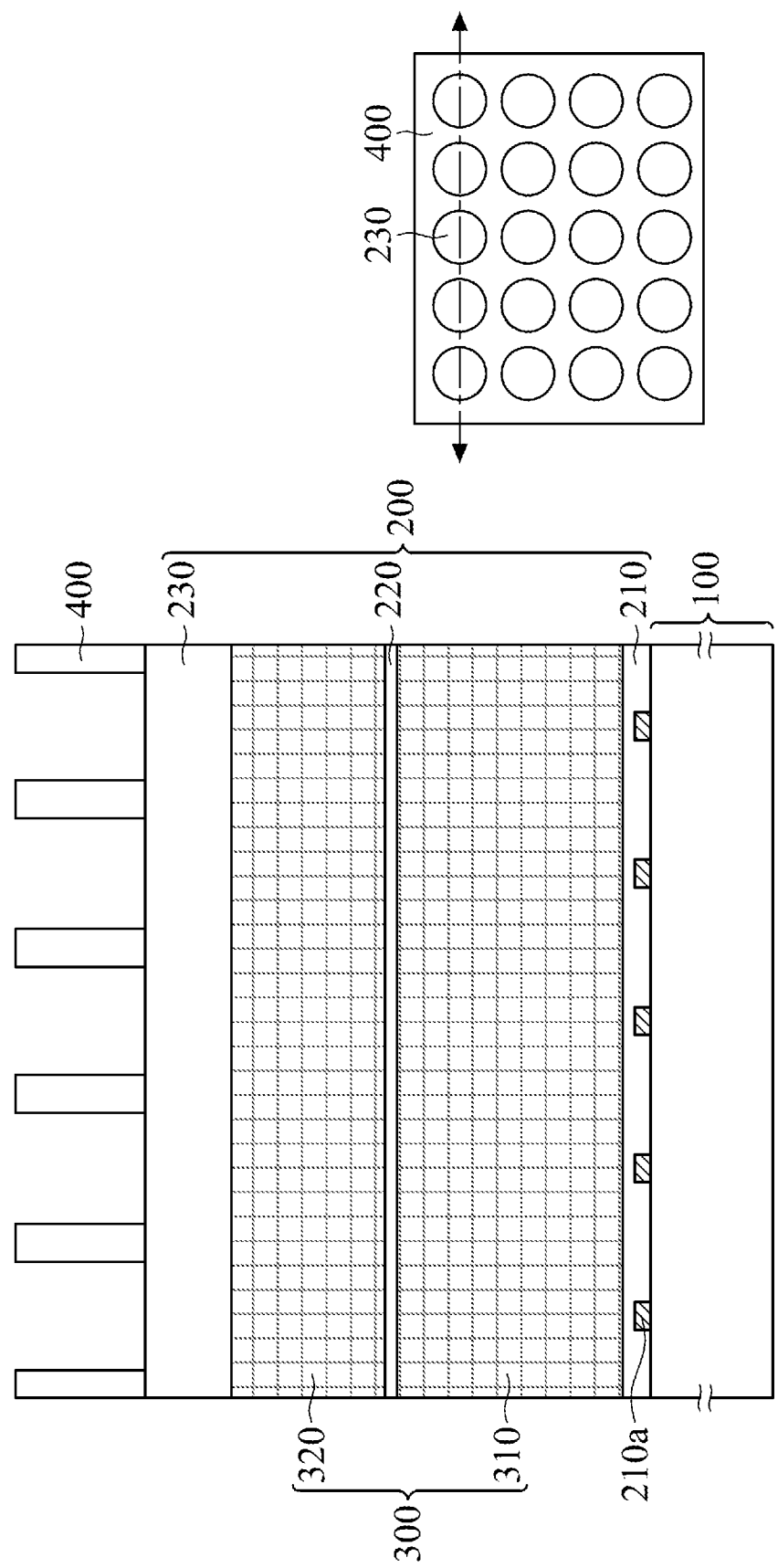

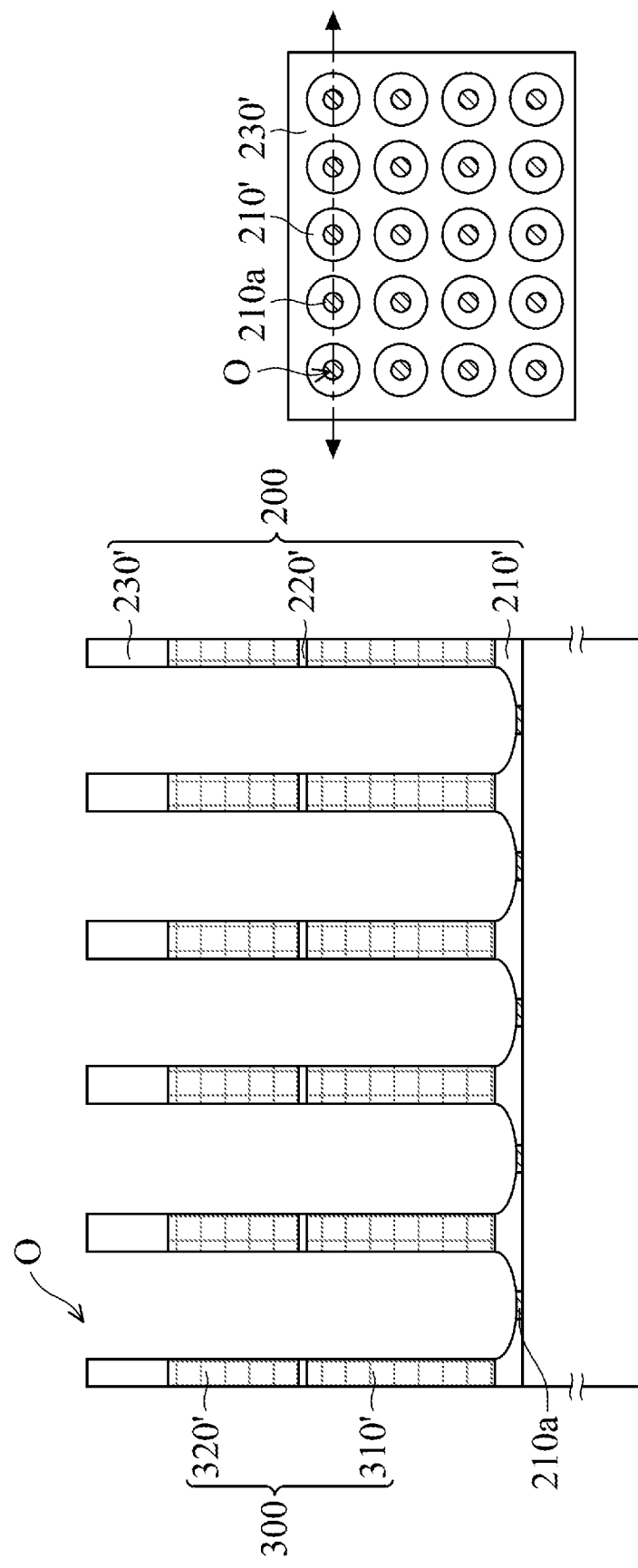

CAPACITOR AND METHOD FOR FORMING THE SAME

CROSS REFERENCE TO RELATED APPLICATIONS

This application claims priority of Taiwan Patent Application No. 110123116, filed on Jun. 24, 2021, the entirety of which is incorporated by reference herein.

BACKGROUND

Technical Field

The present disclosure relates to a capacitor, and particularly it relates to a capacitor of a dynamic random access memory and the method for forming the same.

Description of the Related Art

In recent years, dynamic random access memory (DRAM) is widely used in consumer electronic products. In order to increase the density of elements in dynamic random access memory and improve the entire performance, the fabrication technique of the current dynamic random access memory continues to work toward scaling down of the elements.

However, as the elements continue to shrink, many challenges arise. For example, in the process of forming a capacitor, the bottom electrode is easily affected by etching, which cause the reduction of capacitance. Therefore, the industry still needs to improve the capacitor in dynamic random access memory and the method for forming the same in order to overcome the problems of damage to the lower electrode due to the process.

BRIEF SUMMARY

In accordance with some embodiments of the present disclosure, a capacitor is provided. The capacitor includes cup-shaped lower electrodes disposed on a substrate, a capacitor dielectric layer conformally covering inner surfaces and outer surfaces of the cup-shaped lower electrodes, an upper electrode covering a surface of the capacitor dielectric layer, and a support layer disposed between outer surfaces of the cup-shaped lower electrodes to connect the cup-shaped lower electrodes. The capacitor further includes an annealed oxide layer interposed between the inner surfaces of the cup-shaped lower electrodes and the capacitor dielectric layer, and interposed between a portion of the outer surfaces of the cup-shaped lower electrodes and the capacitor dielectric layer. The support layer includes an upper support layer, a middle support layer, and a lower support layer, which respectively connect an upper portion, a middle portion, and a lower portion of the outer surfaces of the cup-shaped lower electrodes.

In accordance with some embodiments of the present disclosure, a method for forming a capacitor is provided. The method includes the following steps. Providing a substrate. Sequentially forming a support layer and a template layer on the substrate. Forming cup-shaped openings in the template layer and the support layer. Forming a lower electrode material in the cup-shaped openings and on the top surface of the support layer. Removing the lower electrode material layer on the top surface of the support layer, so that the remaining lower electrode material layer is used as cup-shaped lower electrodes. Removing an upper portion of the support layer, so that sidewalls of the cup-shaped lower electrodes protrude from the top surface of the support layer. Forming an oxide layer on the surfaces of the cup-shaped lower electrodes and on the surface of the support layer. Annealing the oxide layer to form an annealed oxide layer. Forming a protective layer on the annealed oxide layer, wherein the protective layer closes the tops of the cup-shaped openings. Forming a mask on top surfaces of a portion of the cup-shaped lower electrodes. Removing the protective layer and the support layer which are not covered by the mask. Removing the remaining protective layer, the template layer, and a portion of the annealed oxide layer, so that the remaining annealed oxide layer is attached to the inner surfaces of the cup-shaped lower electrodes. Forming a capacitor dielectric layer on the surfaces of the cup-shaped lower electrodes, on the surfaces of the remaining annealed oxide layer, and on the surfaces of the support layer. Forming an upper electrode on the surfaces of the capacitor dielectric layer.

BRIEF DESCRIPTION OF THE DRAWINGS

To make the features and advantages of the present invention more obvious and understandable, different embodiments are specially cited below, and detailed descriptions are as follows in conjunction with the accompanying drawings:

FIGS. 1, 2, 4, 6, 8, 10, 12, 14, 16, 18, and 21 illustrate cross-sectional views of forming a capacitor at various stages according to some embodiments of the present disclosure.

FIGS. 3, 5, 7, 9, 11, 13, 15, 17, and 19 illustrate top views of the capacitor corresponding to cross-sectional views in FIGS. 2, 4, 6, 8, 10, 12, 14, 16 and 18 according to some embodiments of the present disclosure, wherein the cross-section lines between arrows in the top views corresponds to the cross section views.

DETAILED DESCRIPTION

Figure 1:
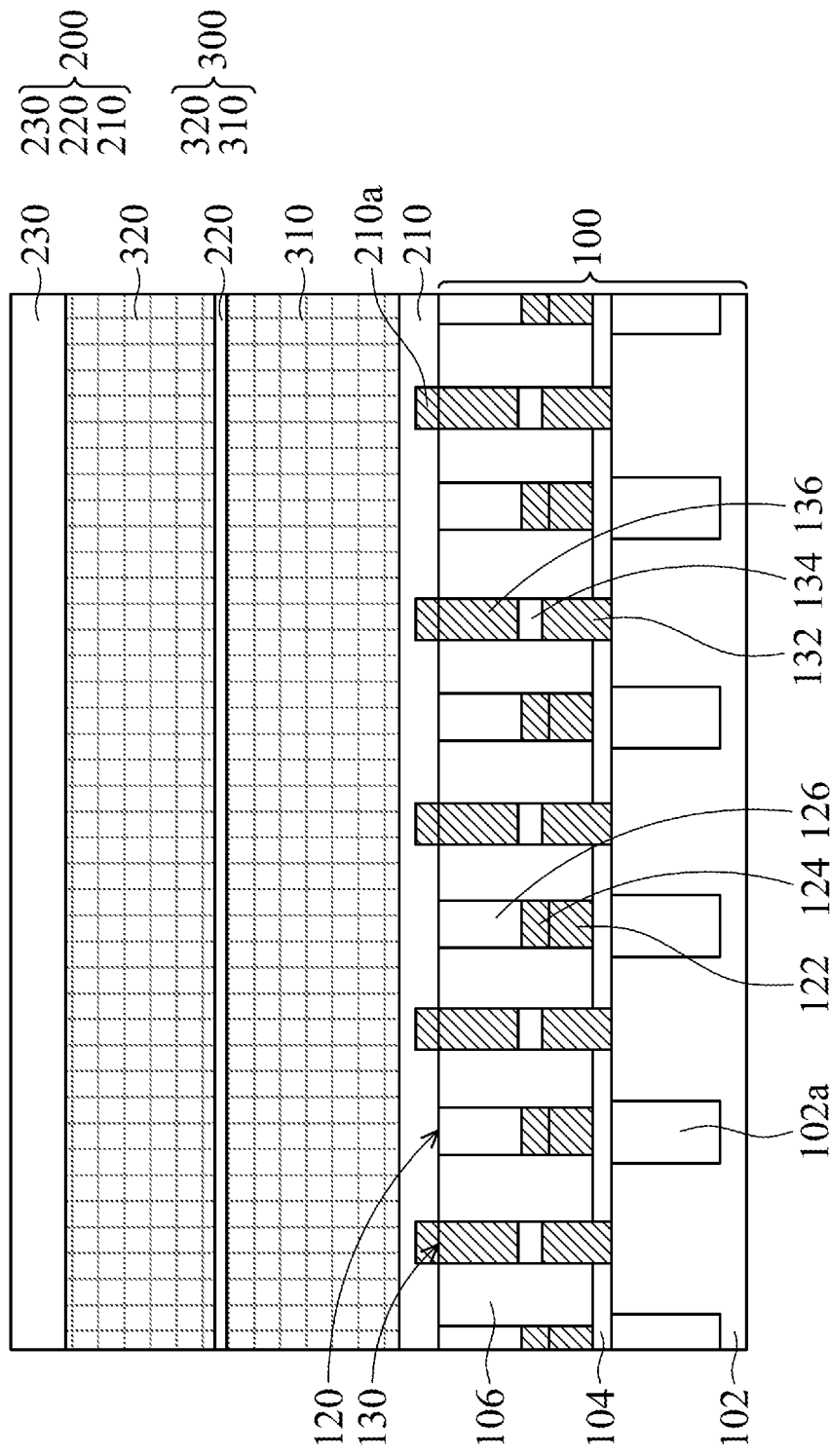

FIG. 1 illustrates a cross-sectional view of forming a capacitor according to some embodiments of the present disclosure.

First, a substrate 100 is provided. In FIG. 1, the substrate 100 includes a base 102, a cap layer 104, and a dielectric layer 106.

In some embodiments, the base 102 includes an isolation structure 102*a* disposed therein to define an active region. A word line (not shown) is further embedded in the base 102. In some embodiments, the word line serves as a gate, which includes a gate dielectric layer, a gate liner, and a gate electrode (not shown).

In some embodiments, the cap layer is disposed on the base 102. The cap layer 104 may include silicon oxide (such as thermal silicon oxide, tetraethylorthosilicate (TEOS) oxide), silicon nitride (SiN), silicon oxynitride (SiON), or a combination thereof.

In some embodiments, the dielectric layer 106 is disposed on the cap layer 104. The dielectric layer 106 may include silicon nitride, silicon oxynitride, phosphosilicate glass (PSG), borophosphosilicate glass (BPSG), spin-on glass (SOG), undoped silicate glass (USG), tetraethylorthosilicate (TEOS) oxide, low-k dielectric materials, and/or other suitable dielectric materials, and the like.

In some embodiments, the substrate 100 further includes a bit line 120 and a capacitor contact 130 disposed in the dielectric layer 106. The bit line 120 includes conductive layers 122 and 124 and a dielectric layer 126. The conductive layers 122 and 124 may include conductive materials, which include doped polysilicon, metal, or metal nitride, such as tungsten (W), titanium (Ti), titanium nitride (TiN), and the like. The dielectric layer 126 may include a dielectric material, which includes nitride or oxide, such as silicon nitride or silicon oxide.

In some embodiments, the capacitor contact 130 includes a conductive layer 132, a silicide layer 134, and a conductive layer 136. The material of the conductive layer 132 is similar to that of the conductive layers 122 and 124. The silicide layer 134 may include a metal silicide layer, such as cobalt silicide.

As shown in FIG. 1, a support layer 200 and a template layer 300 are formed on the substrate 100 sequentially. In the embodiment of FIG. 1, the support layer 200 and the template layer 300 are alternately arranged up and down. Specifically, the lower support layer 210, the lower template layer 310, the middle support layer 220, the upper template layer 320, and the upper support layer 230 are sequentially formed. In some embodiments, the support layer 200 is used to connect the cup-shaped lower electrode to be formed later.

In some embodiments, the lower support layer 210 includes a contact pad 210a for subsequent electrical connection between the capacitor contact 130 and the cup-shaped lower electrode (not shown). The contact pad 210a includes a conductive material, which is similar to the conductive layer 136 described above, and will not be repeated here.

In some embodiments, the support layer 200 and the template layer 300 includes materials with etching selectivity. The materials of the support layer 200 may be nitride, such as silicon nitride, silicon oxynitride, silicon carbon oxynitride, silicon carbide, or a combination thereof. In some embodiments, the materials of the template layer 300 may be an oxide, such as silicon oxide, borophosphosilicate glass, or a combination thereof.

As shown in FIG. 2, a mask 400 is formed on the upper support layer 230. Also referring to FIG. 3, the mask 400 is patterned to form an array of openings to expose the upper support layer 230 below. The mask 400 will be used to define cup-shaped openings (not shown) that forms cup-shaped bottom electrodes in the following.

In some embodiments, the mask 400 may be a photoresist layer. The mask 400 may be a hard protective layer, which includes oxide, oxynitride, or other suitable dielectric materials.

Figures 4, 5:
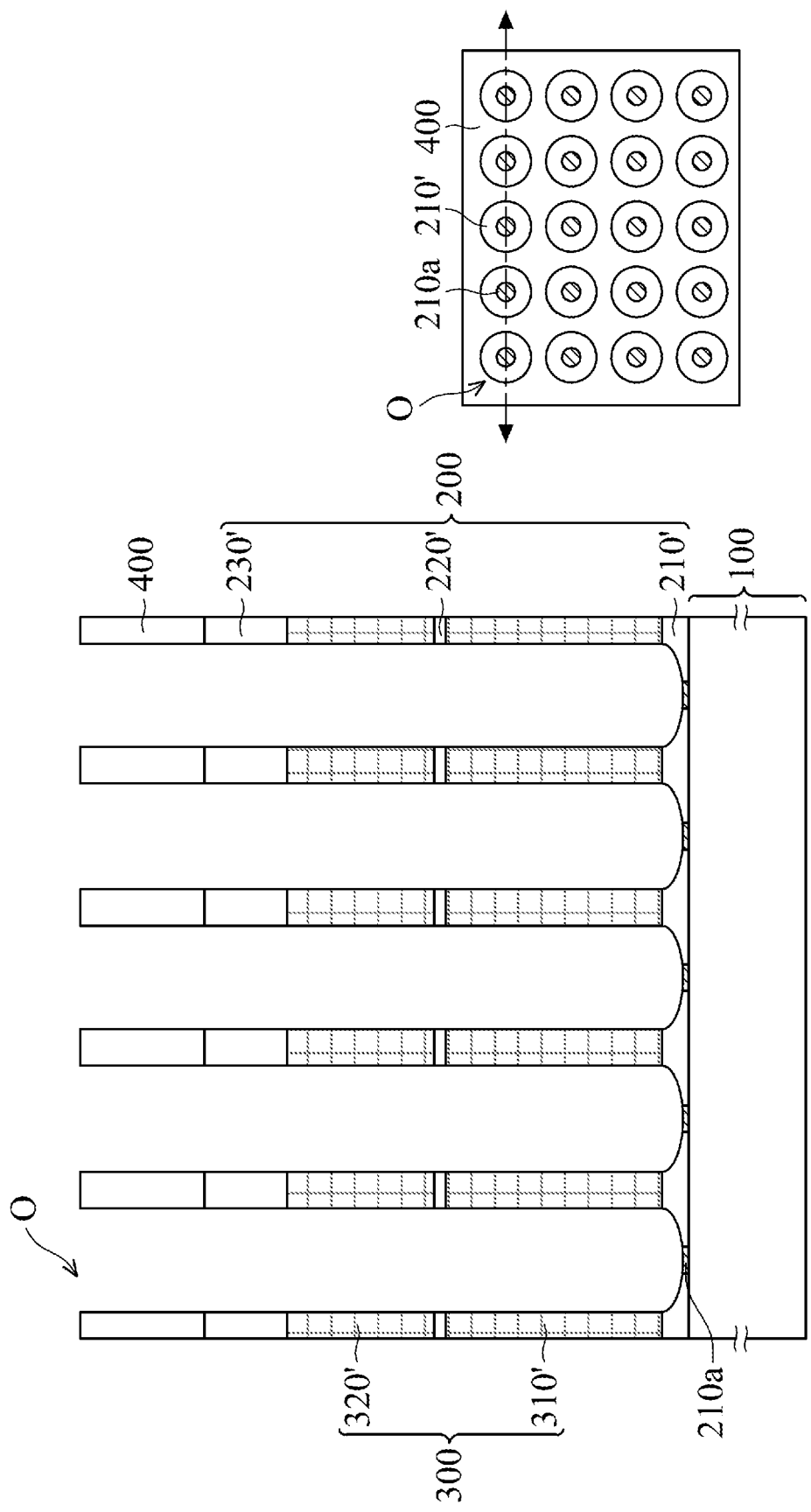

Next, as shown in FIG. 4, cup-shaped openings O are formed in the template layer 300 and the support layer 200. The cup-shaped openings O penetrate the upper support layer 230', the upper template layer 320', the middle support layer 220', and the lower template layer 310' and expose the contact pad 210a in the lower support layer 210'. The cup-shaped openings O do not penetrate the lower support layer 210'.

Also referring to FIG. 5, the cup-shaped openings O may be arranged in an array. In the embodiment of FIG. 5, in the radial direction extending from the center of the cup-shaped openings O, the contact pad 210a, the lower support layer 210' and the mask 400' are sequentially arranged.

In some embodiments, the aspect ratio of the cup-shaped openings O is greater than 10 and less than 100. Within the above range, the contact area between the subsequent lower electrode and the capacitor dielectric layer may be increased without shifting or tipping of the cup-shaped lower electrode formed subsequently.

In some embodiments, the formation of the cup-shaped openings O includes using the mask 400 as an etching mask, and etching the support layer 200 and the template layer 300 that are not covered by the mask 400 by an etching process. Next, as shown in FIG. 6, the mask 400 is removed.

Also referring to FIG. 7, in the radial direction extending from the center of the cup-shaped openings O, the contact pad 210a, the lower support layer 210' and the upper support layer 230' are sequentially arranged.

Figures 8, 9:
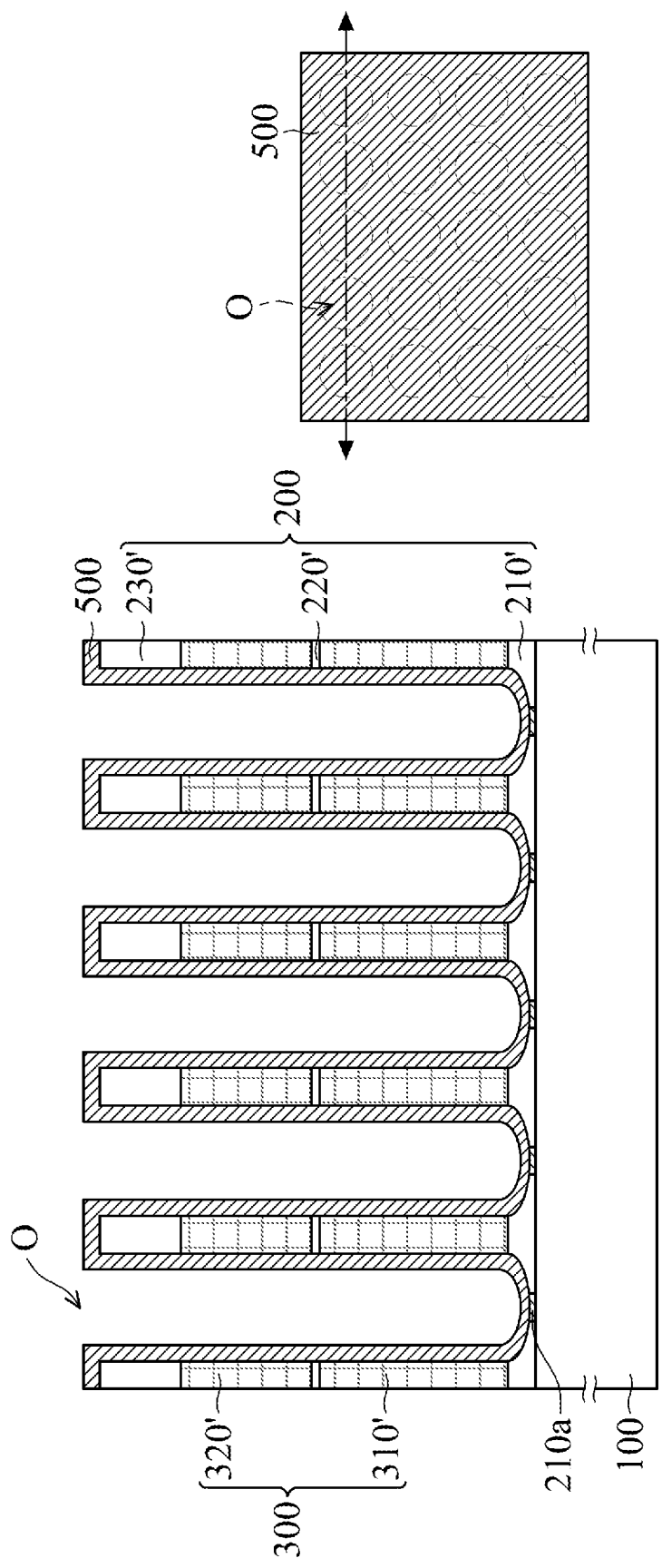

Next, as shown in FIG. 8, a lower electrode material layer 500 is conformally formed along the sidewall and the top surface of the support layer 200. Specifically, the lower electrode material layer 500 is conformally formed on the top surface of the lower support layer 210' (including the contact pad 210a), on the sidewall surfaces of the lower template layer 310', the middle support layer 220', the template layer 320', the sidewall surfaces and the top surface of the upper support layer 230'.

Also referring to FIG. 9, the lower electrode material layer 500 covers the surface of the cup-shaped openings O, so the cup-shaped openings O under the bottom electrode material layer 500 is represented by dashed lines.

In some embodiments, the materials of the lower electrode material layer 500 may include metal, metal nitride, or metal silicide, such as titanium nitride, tantalum nitride, tungsten, titanium tungsten, aluminum, copper, titanium, and the like.

Figures 10, 11:
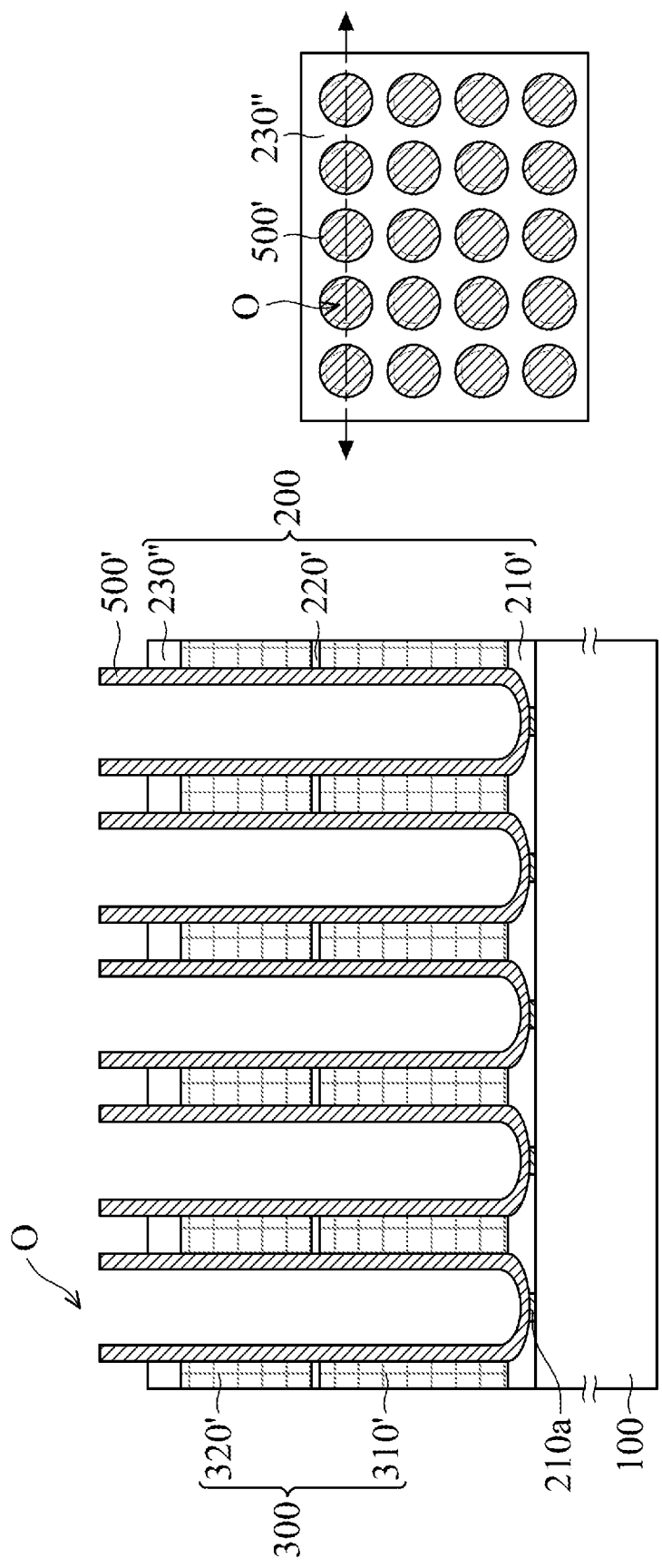

Next, as shown in FIG. 10, the lower electrode material layer 500 on the top surface of the support layer 200 is removed, and the remaining lower electrode material layer serves as cup-shaped lower electrodes 500'. Also, removing the lower electrode material layer 500 also removes an upper portion of the support layer 200, so that the sidewalls of any two adjacent cup-shaped lower electrodes 500' protrude from the top surface of the support layer 200.

In some embodiments, the removal of the lower electrode material layer 500 and the removal of the upper portion of the support layer 200 are performed at the same time by dry etching. The dry etching has a selective etching ratio (etching rate ratio) of the cup-shaped lower electrode material layer 500 to the support layer 200 of about 10:1-30:1. Within the above etching selective ratio, the top surface of the lower electrode material layer may be cut off.

In some embodiments, removing the upper portion of the support layer 200 includes removing the upper portion of the upper support layer 230' to reduce the height of the upper support layer 230', so that the subsequently formed annealed oxide layer may remain in the outer surface of the cup-shaped lower electrodes to facilitate maintaining the height of the cup-shaped lower electrodes. Here, the upper support layer 230' whose height has been reduced is denoted as 230".

In some embodiments, the lower support layer 210' extends continuously at the bottoms of each cup-shaped lower electrode 500'. The middle support layer 220' connects the middle portion of the outer surfaces of each cup-shaped lower electrode 500'. The upper support layer 230" is connected to the upper portion of the outer surfaces of each of the cup-shaped lower electrodes 500'.

Also referring to FIG. 11, each of the cup-shaped openings O is surrounded by one cup-shaped lower electrode 500'. Each of the cup-shaped lower electrodes is surrounded by the upper support layer 230". It should be noted that the lower electrode material layer 500 (or the cup-shaped lower electrode 500') still covers the surfaces of the cup-shaped openings O, so the cup-shaped openings O under the bottom electrode material layer 500 is still represented by dashed lines.

Figures 12, 13:
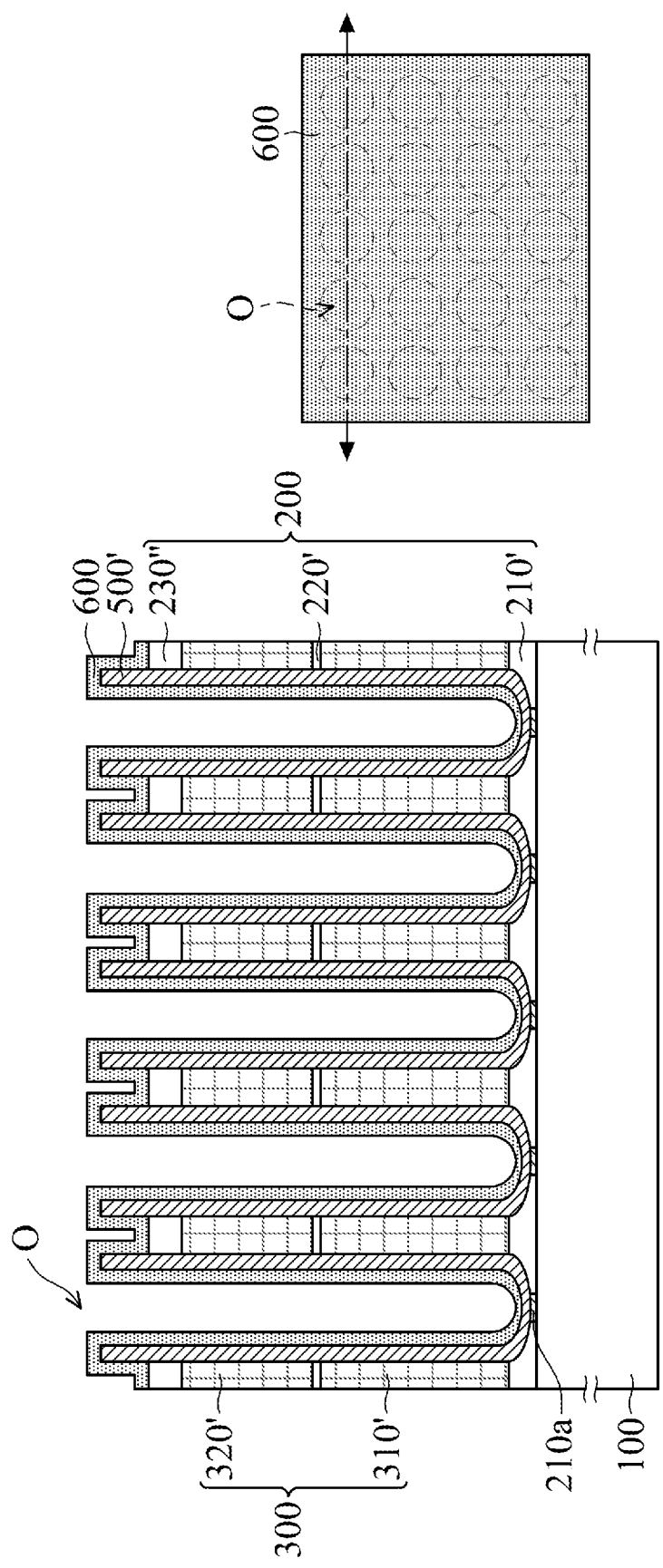

Next, as shown in FIG. 12, an oxide layer is formed on the surfaces of each of the cup-shaped lower electrodes 500' and on the surface of the support layer 200. The oxide layer includes metal oxide, such as aluminum oxide. Next, the oxide layer is annealed to form an annealed oxide layer 600.

In some embodiments, the annealed oxide layer 600 is formed on the inner and outer surfaces of the cup-shaped lower electrodes 500' by an annealing process, which may reduce the work function and inhibit the leakage current of the high-k dielectric. In some embodiments, the annealed oxide layer 600 may further protect the cup-shaped lower electrodes 500' from being affected by subsequent process, thereby avoiding reducing the height of the cup-shaped lower electrodes 500'.

In some embodiments, the cup-shaped lower electrodes 500' include metal, such as titanium and titanium nitride. In some embodiments, the annealing process may make the annealed oxide layer 600 contain the same metal element or/and oxide of the same metal as the cup-shaped lower electrode 500' to increase the resistance and improve the capacitance. The annealed oxide layer 600 includes TiAl, TiAlO, $TiO_x$, $Al_2O_3$, and the like.

Also referring to FIG. 13, the annealed oxide layer 600 covers the surfaces of the cup-shaped openings, so the cup-shaped openings O under the annealed oxide layer 600 are represented by dashed lines.

Figures 14, 15:
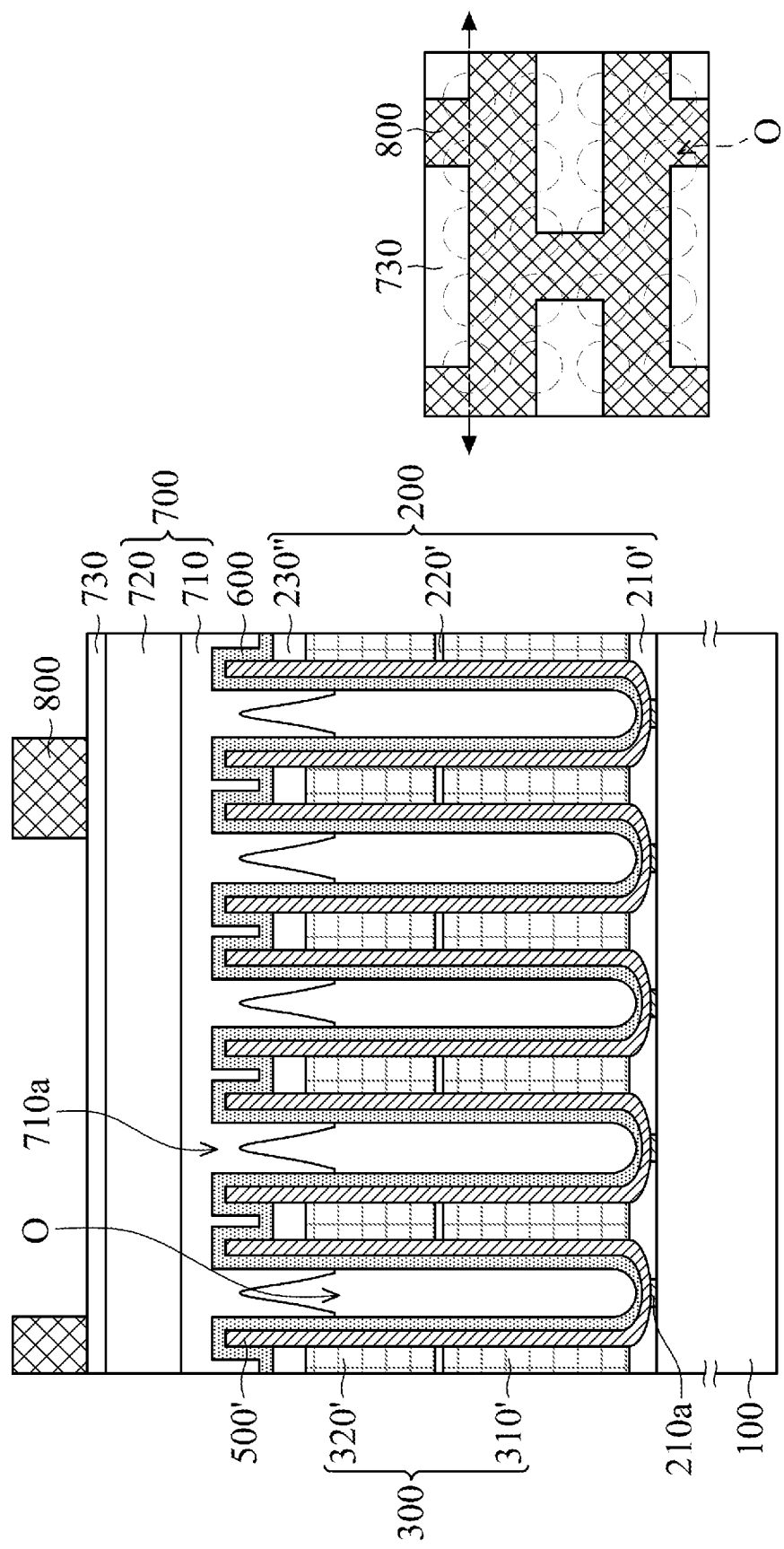

Next, as shown in FIG. 14, a protective layer 700 is formed on the annealed oxide layer 600, wherein the protective layer 700 covers the tops of the cup-shaped openings O. Next, a mask 800 is formed on the top surface of a portion of the cup-shaped lower electrodes 500'.

In some embodiments, the protective layer 700 is formed to provide a flat surface to facilitate subsequent pattern definition. In some embodiments, the protective layer 700 includes a first protective layer 710 and a second protective layer 720. In other embodiments, the protective layer 700 may include only one protective layer.

In the embodiment of FIG. 14, since the aspect ratio of the cup-shaped openings O is quite large, the step coverage of the first protective layer 710 is poor. Thus, the upper sidewall of the cup-shaped opening O is covered by the first protective layer 710, and the top of the cup-shaped opening O is closed by an overhang 710a of the first protective layer 710. Thus, the cup-shaped openings O are not filled completely.

In some embodiments, the first protective layer 710 and the second protective layer 720 may include oxygen-containing materials or carbon-containing materials, such as silicon oxide or carbon or the like.

Next, still referring to FIG. 14, after forming the second protective layer 720, an anti-reflection layer 730 may be further formed on the second protective layer 720 to prevent the reflection of the underlying film during exposure, which helps to improve the pattern transfer.

Next, still referring to FIG. 14, the mask 800 is formed on the top surface of a portion of the cup-shaped lower electrodes 500'. Also referring to FIG. 15, the mask 800 covers a portion of each of the cup-shaped openings O (corresponding to the cup-shaped lower electrode) and exposes the other portion of each of the cup-shaped openings O (corresponding to the cup-shaped lower electrode). In some embodiments, each region, which is not covered by the mask 800, includes openings O to facilitate subsequent removal of the template layer 300.

Figures 16, 17:
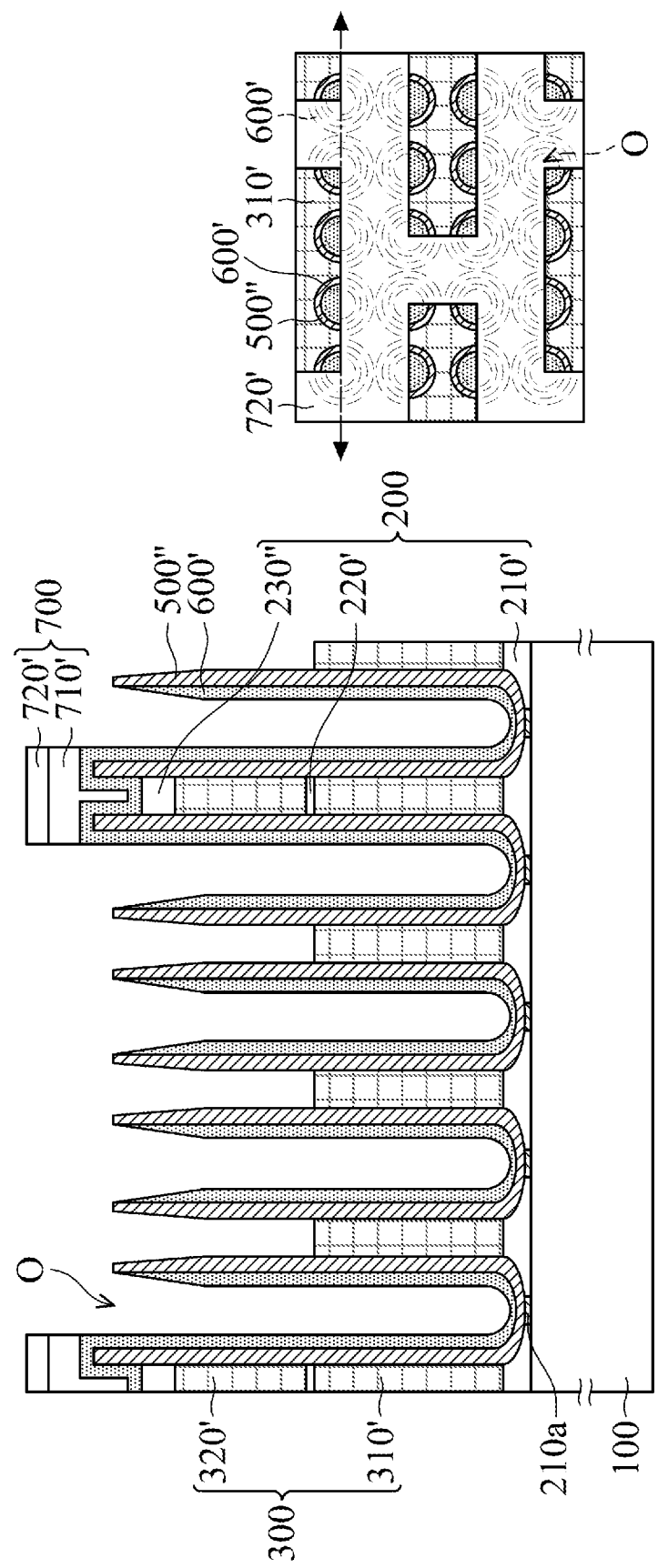

Next, as shown in FIG. 16, the protective layer 700 and the support layer 200, which are not covered by the mask 800 will be removed, and the mask 800 is subsequently removed. Specifically, the second protective layer 720, the first protective layer 710, the upper support layer 230", the upper template layer 320', and the middle support layer 220', which are not covered by the mask 800 are removed. In some embodiments, the removal of the protective layer 700 and the support layer 200 further includes removing a portion of the annealed oxide layer 600 and a portion of the cup-shaped lower electrodes 500'. In detail, the removal of the portion of the annealed oxide layer 600 includes removing the annealed oxide layer 600 which is not covered by the mask 800 and is located on the outer surfaces of the cup-shaped lower electrodes 500'. The removal of the portion of the cup-shaped lower electrode 500' includes thinning the upper portion of the cup-shaped lower electrode 500' which is not covered by the mask 800. Since the cup-shaped openings O have a relatively large aspect ratio, even if the annealed oxide layer 600 not covered by the mask 800 is removed, a portion of the annealing oxide layer 600 will remain on the inner surface of the cup-shaped lower electrode 500'. Here, the remaining annealed oxide layer 600 is denoted as 600', and the remaining cup-shaped lower electrodes 500' are denoted as 500".

In some embodiments, the removal of the protective layer 700 and the support layer 200, which are not covered by the mask 800, may include dry etching using halogenated hydrocarbon etchant (such as $CF_4$, $CHF_3$, $CH_2F_2$, or the like). The ratio of halogenated hydrocarbon carbon, fluorine, and hydrogen may improve the etching selectivity of the etchant to the cup-shaped lower electrode 500'. Therefore, the protective layer 700 and the support layer 200 may be removed while reducing damage to the cup-shaped lower electrodes 500'.

Compared with the case where the top surface of the lower electrode material layer is continuously removed after the mask is formed, the embodiment of the present disclosure removes the top surface of the lower electrode material layer 500 before the mask 800 is formed. Thus, the distance between the top surface of the cup-shaped lower electrode 500" and the upper support layer 230" is increased, thereby increasing the contact area between the subsequent capacitor dielectric layer 900 and the cup-shaped lower electrode 500". In addition, the embodiment of the present disclosure further forms an annealed oxide layer 600 after removing the top surface of the lower electrode material layer 500, which may protect the cup-shaped lower electrode 500" from damage during the subsequent process.

In addition, compared to the removal of the upper support layer and the middle support layer that are not covered by the mask in two steps, the embodiment of the present disclosure uses one step to remove the upper support layer 230" and the middle support layer 220' to reduce one cleaning process, thereby achieving the simplification of the process and reducing the damage of the cup-shaped lower electrodes 500' during the process.

Also referring to FIG. 17, the cup-shaped lower electrode 500" and the annealed oxide layer 600' covered by the second protective layer 720' are represented by dashed lines. It can be seen from FIG. 17 that the cup-shaped lower electrodes 500" and the annealed oxide layer 600', which surround the cup-shaped opening O, are both partially covered by the second protective layer 720' and are partially exposed. In addition, the annealed oxide layer 600' covered by the second protective layer 720' is located inside and outside the cup-shaped lower electrodes 500", while the annealed oxide layer 600' not covered by the second protective layer 720' is located only inside the cup-shaped lower electrodes 500".

Figure 18:
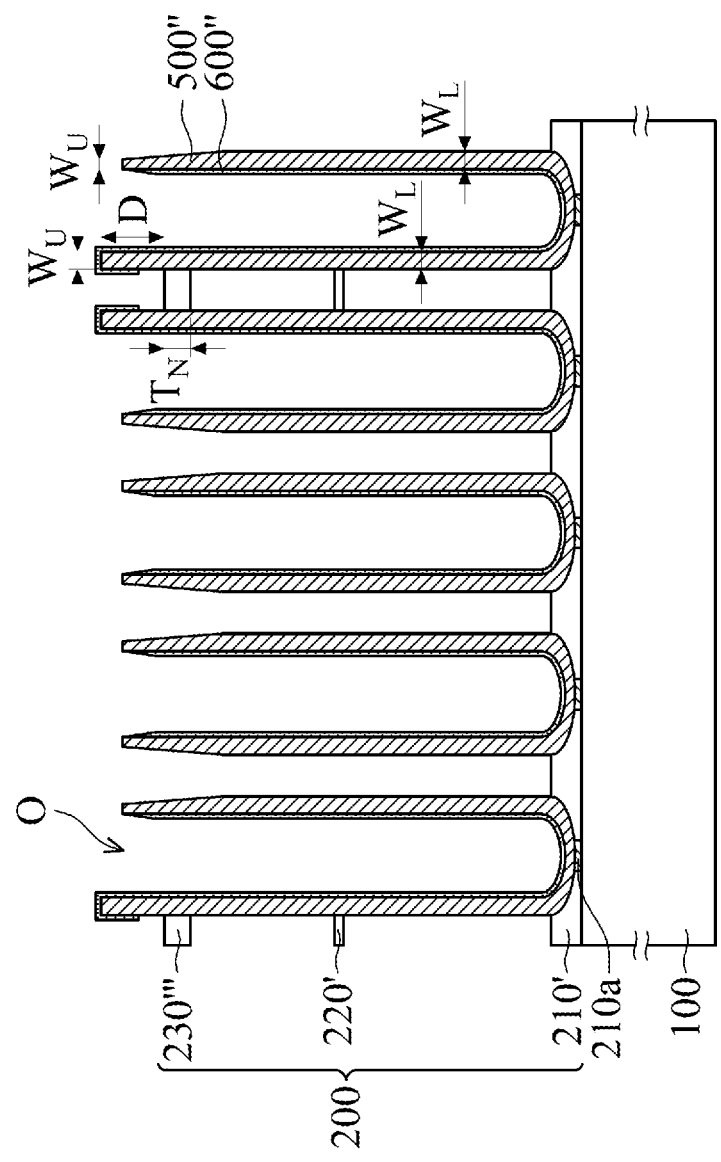

Next, as shown in FIG. 18, the remaining protective layer 700, the template layer 300, and a portion of the annealed oxide layer 600' are removed, so that the remaining annealed oxide layer 600" is attached to the inside surface of the cup-shaped lower electrodes 500". Specifically, the remaining second protective layer 720', the first protective layer 710', the upper template layer 320, the lower template layer 310, and a portion of the annealed oxide layer 600' are removed. This removal step further includes removing a portion of the upper support layer 230" so that the remaining upper support layer 230" does not contact the annealed oxide layer 600". Here, the remaining upper support layer 230" is denoted as 230'''.

In some embodiments, this removal step reduces most of the thickness of the annealed oxide layer 600' and leaves only a thin film on the surfaces of the cup-shaped lower electrodes 500". The thin film includes high-k $TiO_x$ dangling bonds formed by the annealing process performed on the surfaces of the cup-shaped lower electrodes 500".

In some embodiments, an annealed oxide layer 600" is located on the inner surface of each of the cup-shaped lower electrodes 500". The annealed oxide layer 600" further extends to the top surface and a portion of the outer surface of the cup-shaped lower electrodes 500" with the upper support layer 230''' on the outer surface, but does not contact the upper support layer 230".

In some embodiments, the ratio of the distance D from the top surface of the cup-shaped lower electrodes 500" to the top surface of the upper support layer 230''' and the thickness TN of the upper support layer 230''' is 0.8 or more. Within the above ratio, the coverage area of the capacitor dielectric layer is increased, thereby improving the capacitance value. In some embodiments, the ratio of the distance D to the thickness TN may be about 1, for example.

In some embodiments, the sidewalls of the cup-shaped lower electrodes 500" with the upper support layer 230''' on the outer surface are higher than the sidewalls of the cup-shaped lower electrode 500" without the upper support layer 230" on the outer surface.

In some embodiments, since the inner surface of the cup-shaped lower electrode 500" is protected by the annealed oxide layer 600", the inner surface of the sidewall of the cup-shaped lower electrode 500" is substantially unaffected by etching. The annealed oxide layer 600' shrinks into a cone shape on the upper portion due to etching. On the other hand, since a portion of the outer surfaces of the sidewalls of the cup-shaped lower electrodes 500" is affected by etching, the width at the upper portion thereof is also reduced. Specifically, the width of the upper portion of the sidewalls of the cup-shaped lower electrodes 500" that do not have the upper support layer 230''' on the outer surface is smaller than the width of the lower portion (WU<WL). In contrast, the upper portion of the sidewalls of the cup-shaped lower electrode 500" with the upper support layer 230''' on the outer surface have substantially the same width as the lower portion (WU=WL). It should be noted that the term "substantially the same" may include the same or a variation within 10%.

In some embodiments, the ratio of the average width of the annealed oxide layer 600" to the average width of the cup-shaped lower electrode 500" is greater than 0 and equal to or less than 1.7. In this way, the capacitance value may be further increased while reducing the leakage current. The average width of the annealed oxide layer 600" is approximately 2.5 Å-20 Å.

In some embodiments, the support layer 200 is located between the outer surfaces of the cup-shaped lower electrodes 500" to connect the cup-shaped lower electrodes. The upper support layer 230''', the middle support layer 220', and the lower support layer 210' are respectively connected to the upper, middle, and lower portions of the outer surfaces of the cup-shaped lower electrodes to strengthen the mechanical strength of the capacitor, thereby avoiding phenomenon of capacitor deformation or even tipping.

Figure 19:
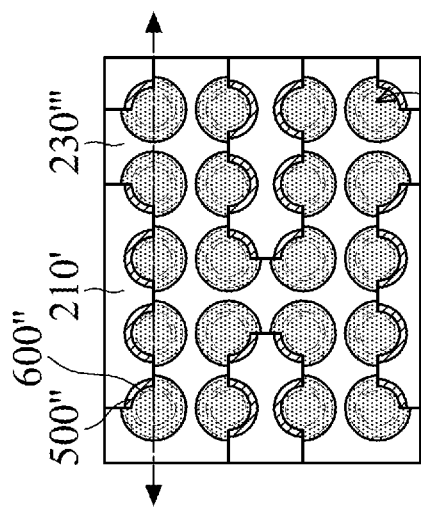
Figure 20:
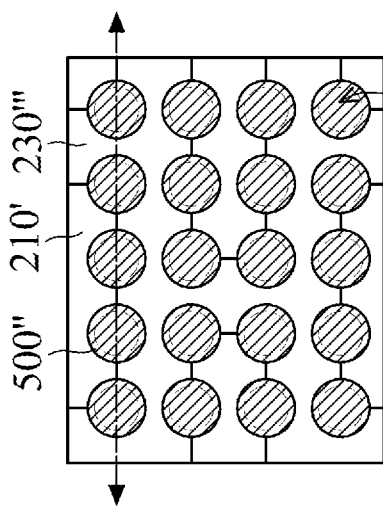
FIG. 20 illustrates a top view of a portion of elements of the capacitor corresponding to cross-sectional view in FIG. 18 according to some embodiments of the present disclosure.

Also referring to FIGS. 19 and 20, FIG. 19 also shows the relative positions of the cup-shaped bottom electrodes 500" and the annealed oxide layer 600" in the top view, while FIG. 20 only shows the relative position of the cup-shaped lower electrodes 500" in the top view. In detail, in FIG. 20, each of the cup-shaped opening O is surrounded by one cup-shaped lower electrode 500". In addition, the position covered by the mask 800 (refer to FIG. 15) will expose the upper support layer 230" in the top view at this stage, while the position not covered by the mask 800 (refer to FIG. 15) will expose the lower support layer 210' in the top view at this stage.

Correspondingly referring to FIG. 19, the annealed oxide layer 600" at the position not covered by the mask 800 (referring to FIG. 15) is only located inside each of the cup-shaped lower electrodes 500", while the annealing oxide layer 600" at the position covered by the mask 800 (referring to FIG. 15) is located inside, outside, and above each of the cup-shaped lower electrode 500". That is, in FIG. 19, the annealed oxide layer 600" completely covers the inner side of each of the cup-shaped lower electrodes 500" but only partially covers the upper and outer sides of each of the cup-shaped lower electrodes 500".

Figure 21:
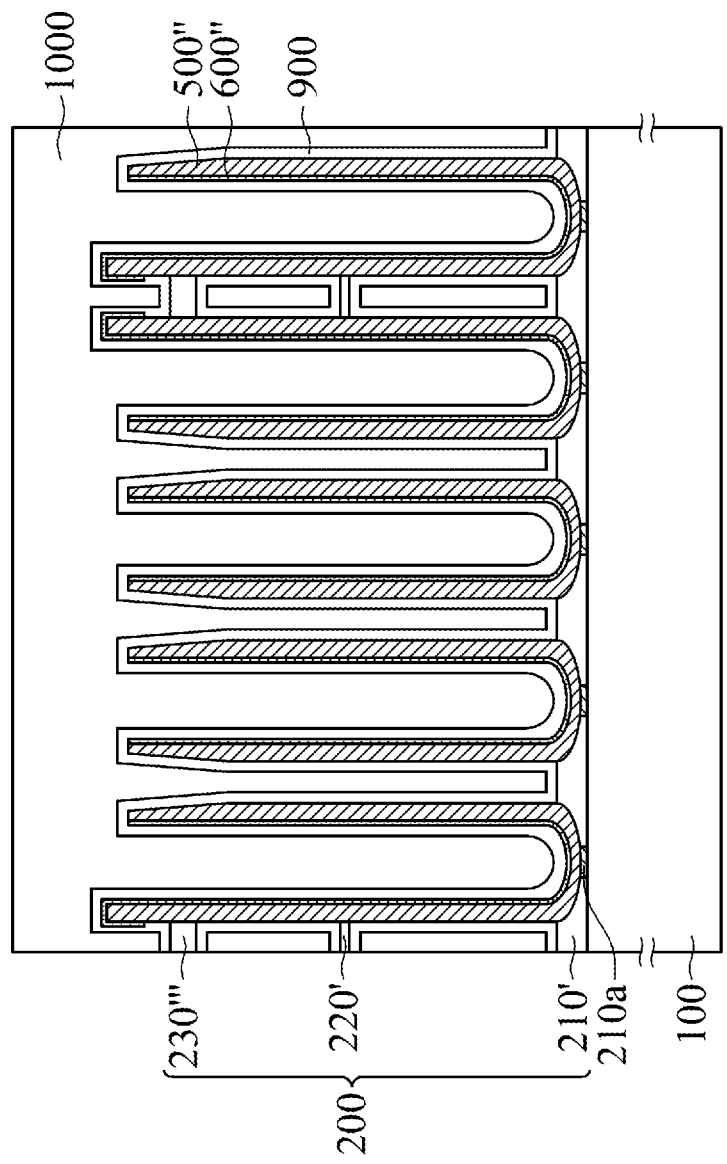

Next, as shown in FIG. 21, a capacitor dielectric layer 900 is formed on the surfaces of the cup-shaped lower electrodes 500", on the surface of the remaining annealed oxide layer 600", and on the surface of the support layer 200.

In some embodiments, the capacitor dielectric layer 900 conformally covers the inner and outer surfaces of the cup-shaped lower electrodes 500". The annealed oxide layer 600" is sandwiched between the capacitor dielectric layer 900 and the inner surface of the cup-shaped lower electrode 500" and is sandwiched between the capacitor dielectric layer 900 and a portion of the outer surface of the cup-shaped lower electrode 500", thereby inhibiting the generation of leakage current. The annealed oxide layer 600" is further sandwiched between the capacitor dielectric layer 900 and a portion of the top surface of the cup-shaped lower electrode 500".

In some embodiments, the capacitor dielectric layer 900 may include high-k dielectric materials, such as hafnium oxide (HfO), zirconium oxide (ZrO), aluminum oxide (AlO), aluminum nitride (AlN), Titanium oxide (TiO), lanthanum oxide (LaO), yttrium oxide (YO), gamma oxide (GdO), tantalum oxide (TaO), or a combination thereof.

Next, as shown in FIG. 21, an upper electrode 1000 is formed on the surface of the capacitor dielectric layer 900. In some embodiments, the upper electrode 1000 covers the surface of the capacitor dielectric layer 900.

In some embodiments, the upper electrode 1000 may include metal, metal silicide, metal nitride or metal alloy, such as titanium nitride (TiN), tantalum nitride (TaN), tungsten (W), titanium tungsten (TiW), aluminum (Al), copper (Cu), or the like.

In summary, the embodiment of the present disclosure may protect the lower electrode from being affected by the process by forming an annealed oxide layer. By the annealing oxide layer sandwiched between a portion of the surface of the lower electrode and the capacitor dielectric layer, the work function may be reduced and leakage current may be inhibited. Forming the cup-shaped lower electrodes and the annealed oxide layer before the protective layer is formed may reduce the risk of greatly reducing the height of the cup-shaped lower electrodes when the template layer is removed. When removing the template layer, the upper support layer and the middle support layer may be removed together in the same step, which may reduce the complexity of the process. The strengthening structure formed by the lower support layer, the middle support layer, and the upper support layer increases the mechanical strength of the capacitor to avoid the phenomenon of deformation or even tipping of the capacitor. As above, the embodiment of the present disclosure may increase the capacitance value.

Although the present invention is disclosed in the foregoing embodiments, it is not intended to limit the present invention. Those with ordinary skill in the technical field to which the present invention pertains can make some changes and modifications without departing from the spirit and scope of the present invention. Therefore, the scope of protection of the present invention shall be subject to those defined by the scope of the appended claims.

What is claimed is:

1. A method for forming a capacitor, comprising:
providing a substrate;
sequentially forming a support layer and a template layer on the substrate;
forming cup-shaped openings in the template layer and the support layer;
forming a lower electrode material in the cup-shaped openings and on a top surface of the support layer;
removing the lower electrode material layer on the top surface of the support layer, and using the remaining lower electrode material layer as cup-shaped lower electrodes;
removing an upper portion of the support layer, so that sidewalls of the cup-shaped lower electrodes protrude from the top surface of the support layer;
forming an oxide layer on surfaces of the cup-shaped lower electrodes and a surface of the support layer;
annealing the oxide layer to form an annealed oxide layer;
forming a protective layer on the annealed oxide layer, wherein the protective layer closes tops of the cup-shaped openings;
forming a mask on top surfaces of a portion of the cup-shaped lower electrodes;
removing the protective layer and the support layer which are not covered by the mask;
removing the remaining protective layer, the template layer and a portion of the annealed oxide layer, so that the remaining annealed oxide layer is attached to inner surfaces of the cup-shaped lower electrodes;
forming a capacitor dielectric layer on the surfaces of the cup-shaped lower electrodes, on surfaces of the remaining annealed oxide layer and on surfaces of the support layer; and
forming an upper electrode on surfaces of the capacitor dielectric layer.

2. The method as claimed in claim 1, wherein the step of removing the lower electrode material layer on the top surface of the support layer and the step of removing the upper portion of the support layer are performed at the same time.

3. The method as claimed in claim 1, wherein the step of removing the lower electrode material layer on the top surface of the support layer and the step of removing the upper portion of the support layer comprise using dry etching in which selective etching ratio of the lower electrode material layer to the support layer is 10:1-30:1.

4. The method as claimed in claim 1, wherein the step of removing the protective layer and the support layer which are not covered by the mask further comprises removing the annealed oxide layer on outer surfaces of the cup-shaped lower electrodes not covered by the mask.

5. The method as claimed in claim 1, wherein the mask covers a portion of each of the cup-shaped lower electrodes and exposes the other portion of each of the cup-shaped lower electrodes.

6. The method as claimed in claim 1, wherein the lower electrode material layer comprises a metal, and the annealed oxide layer comprises an oxide of the metal.

7. The method as claimed in claim 1, wherein the step of removing the remaining protective layer, the template layer and the portion of the annealed oxide layer further comprise removing a portion of the support layer, so that the remaining support layer does not contact the annealed oxide layer.

8. The method as claimed in claim 1, wherein the step of removing the portion of the annealed oxide layer comprises reducing a thickness of the annealed oxide layer.

9. The method as claimed in claim 1, wherein the protective layer does not fill the cup-shaped openings completely.

10. The method as claimed in claim 1, wherein an aspect ratio of one of the cup-shaped openings is greater than 10.

* * * * *